United States Patent
Nakano et al.

(10) Patent No.: US 6,900,113 B2
(45) Date of Patent: May 31, 2005

(54) METHOD FOR PRODUCING BONDED WAFER AND BONDED WAFER

(75) Inventors: Masatake Nakano, Gunma (JP); Isao Yokokawa, Gunma (JP); Kiyoshi Mitani, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/296,900

(22) PCT Filed: May 29, 2001

(86) PCT No.: PCT/JP01/04499

§ 371 (c)(1),
(2), (4) Date: Nov. 26, 2002

(87) PCT Pub. No.: WO01/93334

PCT Pub. Date: Dec. 6, 2001

(65) Prior Publication Data

US 2003/0153162 A1 Aug. 14, 2003

(30) Foreign Application Priority Data

May 30, 2000 (JP) ........................................ 2000-160499

(51) Int. Cl.[7] ........................... H01L 21/30; H01L 21/46
(52) U.S. Cl. ...................... 438/455; 438/548; 438/459; 438/456; 438/457; 438/974; 438/977
(58) Field of Search ................................ 438/455, 458, 438/459, 200, 457, 906, 974, 977, 753, 706, 456, 407, 481

(56) References Cited

U.S. PATENT DOCUMENTS 5,909,627 A  6/1999  Egloff
6,027,988 A * 2/2000 Cheung et al. ............. 438/513
6,150,239 A * 11/2000 Goesele et al. ............. 438/458
6,274,459 B1 * 8/2001 Chan .......................... 438/475
6,312,797 B1 * 11/2001 Yokokawa et al. ......... 428/336
6,335,535 B1 * 1/2002 Miyake et al. .......... 250/492.21
6,350,703 B1 * 2/2002 Sakaguchi et al. .......... 438/766
6,566,233 B2 * 5/2003 Yokokawa et al. ......... 438/455

FOREIGN PATENT DOCUMENTS

| JP | 60-050970 | 3/1985 |
| JP | 05-090116 | 4/1993 |
| JP | 05-211128 | 8/1993 |
| JP | 08-078647 | 3/1996 |
| JP | 09-239174 | 9/1997 |
| JP | 10-098005 | 4/1998 |
| JP | 11-307747 | 11/1999 |
| JP | 2000-030992 | 1/2000 |
| JP | 2000331899 A * 11/2000 | ........... H01L/21/02 |

* cited by examiner

Primary Examiner—Matthew Smith
Assistant Examiner—Igwe U. Anya
(74) Attorney, Agent, or Firm—Hogan & Hartson, LLP

(57) ABSTRACT

The present invention provides a method for producing a bonded wafer comprising at least an ion implantation process where at least either hydrogen ions or rare gas ions are implanted into a first wafer from its surface to form a micro bubble layer (implanted layer) in the first wafer, a bonding process where the surface subjected to the ion implantation of the first wafer is bonded to a surface of a second wafer, and a delamination process where the first wafer is delaminated at the micro bubble layer, wherein the ion implantation process is performed in divided multiple steps, and a bonded wafer. Thus, there are provided a method for producing a bonded wafer, which is for reducing micro-voids generated in the ion implantation and delamination method and a bonded wafer free from micro-voids.

11 Claims, 3 Drawing Sheets

FIG. 3
(a) PREPARATION OF WAFER
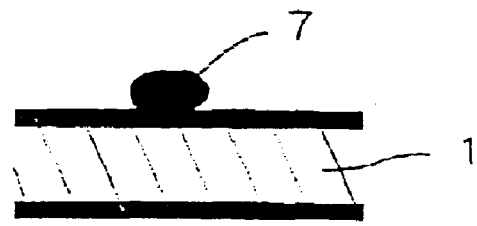
(b) ION IMPLANTATION
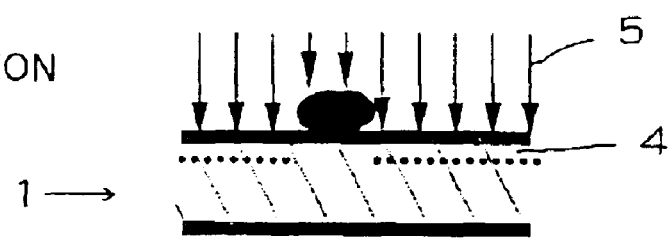
(c) CLEANING
(d) BONDING
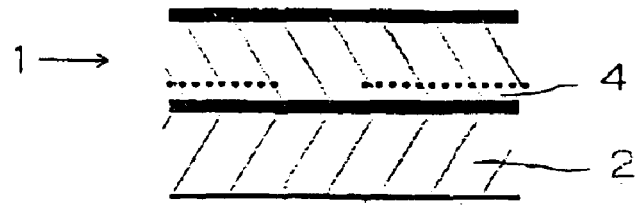
(e) DELAMINATION
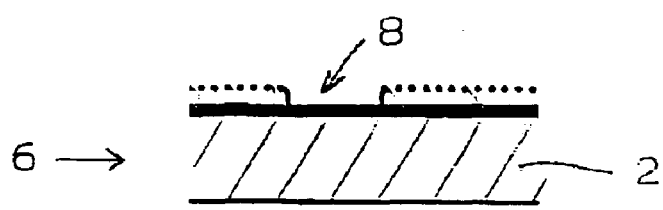

METHOD FOR PRODUCING BONDED WAFER AND BONDED WAFER

TECHNICAL FIELD

The present invention relates to a method for producing a bonded wafer, in which a wafer implanted with hydrogen ions or rare gas ions is bonded to another wafer and then delaminated them at the implanted layer. In particular, it relates to a method for producing a bonded wafer free from defects called micro-voids and such a bonded wafer.

BACKGROUND ART

As a method for producing a bonded SOI (Silicon On Insulator) wafer using the bonding method, there is conventionally known a technique comprising bonding two of silicon wafers via a silicon oxide film, for example, a method comprising forming an oxide film on at least one of such wafers, bonding the wafers to each other without interposing foreign matters between the surfaces to be bonded, and then subjecting them to a heat treatment at a temperature of 200–1200° C. to enhance the bonding strength, as disclosed in Japanese Patent Publication (Kokoku) No. 5-46086.

The bonded wafer, of which bonding strength is enhanced by such a heat treatment, can be subjected to subsequent grinding and polishing processes. Therefore, an SOI layer for fabricating devices can be formed by reducing thickness of the wafer on which devices are to be fabricated to a desired thickness by grinding and polishing.

A bonded SOI wafer produced as described above has advantages of superior crystallinity of the SOI layer and high reliability of a buried oxide layer existing directly under the SOI layer. However, because it is produced through reduction of thickness of the wafer by grinding and polishing, it suffers from a drawback that the reduction of thickness takes a lot of time and generates waste of the material. In addition, the uniformity of the obtainable film thickness is only in such a degree of target thickness ±0.3 $\mu$m or so at most.

Meanwhile, in connection with recent use of higher integration degree and higher processing velocity of semiconductor devices, further reduction of film thickness and improvement of film thickness uniformity are required as for the thickness of the SOI layer. Specifically, a film thickness and uniformity represented as 0.1±0.01 $\mu$m or so are required.

A thin film SOI wafer having such a film thickness and film thickness uniformity cannot be realized in a bonded wafer by the conventional thickness reduction processing using only grinding and polishing. Therefore, the method called ion implantation and delamination method or hydrogen ion delamination method was developed as a novel film thickness reduction technique as disclosed in Japanese Patent Laid-open (Kokai) Publication No. 5-211128.

This ion implantation and delamination method is a technique for producing an SOI wafer, wherein an oxide film is formed on at least one of two silicon wafers, hydrogen ions or rare gas ions are implanted into one wafer (also called "bond wafer") from its top surface to form a micro bubble layer (enclosed layer) in the silicon wafer, then the ion-implanted surface of the wafer is bonded to the other wafer (also called "base wafer") via the oxide film, thereafter one of the wafers is delaminated as a thin film at the micro bubble layer as a cleavage plane (delaminating plane) by subjecting them to a heat treatment (delamination heat treatment), and the bonded wafer is further subjected to a heat treatment (bonding heat treatment) to strengthen the bonding to obtain an SOI wafer.

In this method, the delaminated plane is obtained as a good mirror surface, and an SOI wafer having extremely high uniformity of the film thickness of SOI layer can be obtained relatively easily. In addition, the method also has an advantage that one delaminated wafer can be reused and thus the material can be used effectively.

Further, by this method, it is also possible to directly bond silicon wafers to each other without an oxide film, and it can be used not only for a case where silicon wafers are bonded to each other, but also for a case where an ion-implanted silicon wafer is bonded to an insulator wafer having a different thermal expansion coefficient such as those of quartz, sapphire, silicon nitride, aluminum nitride and so forth or an ion-implanted insulator wafer is bonded to another wafer to obtain a wafer having a thin film of such materials and so forth.

Further, there has also recently been developed a technique, although it is a kind of the ion implantation and delamination method, in which hydrogen ions to be implanted are excited and implanted in a plasma state so as to enable the delamination process at room temperature.

Although this ion implantation and delamination method is an extremely excellent method as a method for producing a bonded SOI wafer, it is necessary to reduce bonding failures called voids, which are generated at the bonded interface, in order to produce such an SOI wafer at a level of mass production with good yield.

It was already elucidated that the major cause of the generation of the voids, which are likely to be generated in a usual bonded wafer produced by not using the ion implantation and delamination method, resides in particles adhered to the bonding surface. According to Japanese Patent No. 2675691, it is described that, if size of the particle is 0.5 $\mu$m or more, voids are generated. That is, if such particles exist on the bonded surface when two wafers are bonded, unbonded portions (voids) will be formed on the bonded interface. Since, as for the size of the voids, the voids have an approximately circular shape having a diameter of about 0.5 millimeter to several tens of millimeters, they can be observed by X-ray topography, ultrasonic reflectoscope, infrared interferometry or the like, even for wafers as they are after the bonding at room temperature or those subjected to a heat treatment thereafter for enhancing the bonding. Therefore, in order to reduce such voids, the bonding can be performed after the wafers are subjected to cleaning for removing the particles adhering to the surfaces to be bonded to remove the particles as much as possible.

However, in case of a bonded wafer produced by using the ion implantation and delamination method, when the bonded wafer surface after the delamination process was precisely observed, it was found that, even if voids having a diameter of about 0.5 millimeter to several tens of millimeters were not generated at all, which are observed in a usual bonded wafer, there may be generated bonding failure portions (called "micro-voids" hereinafter) having a size markedly smaller than the size specified above (a diameter of several micrometers to several tens of micrometers, or even smaller than that).

DISCLOSURE OF THE INVENTION

Therefore, an object of the present invention is to provide a method for producing a bonded wafer, which is for reducing such micro-voids generated in the ion implantation and delamination method and a bonded wafer free from micro-voids.

In order to achieve the aforementioned object, the method for producing a bonded wafer according to the present invention is a method for producing a bonded wafer comprising at least an ion implantation process where at least either hydrogen ions or rare gas ions are implanted into a first wafer from its surface to form a micro bubble layer (implanted layer) in the first wafer, a bonding process where the surface subjected to the ion implantation of the first wafer is bonded to a surface of a second wafer, and a delamination process where the first wafer is delaminated at the micro bubble layer, wherein the ion implantation process is performed in divided multiple steps.

If the ion implantation process is performed in divided multiple steps as described above, bubbles gradually diffuse also into portions shaded from the ion implantation formed directly under the particles adhering to the ion implantation surface, which constitute the cause of the generation of micro-voids, and thus regions having a markedly low ion concentration become smaller. Therefore, there are not caused delamination failures during the delamination heat treatment and thus the generation of the micro-voids can be prevented.

In this case, it is preferable to perform a wafer cleaning process at least once during an interval between the aforementioned multiple ion implantation steps.

If a wafer cleaning process is performed at least once during an interval between the multiple ion implantation steps as above, particles adhering to the ion implantation surface are removed, and therefore disturbance in the ion implantation can be eliminated. Thus, there are not caused delamination failures during the delamination heat treatment and the generation of the micro-voids can be prevented.

Further, in this case, it is preferable to perform the ion implantation with different implantation angles for ions to be implanted in the multiple ion implantation steps.

If the ion implantation is performed with different implantation angles for ions to be implanted in the multiple ion implantation steps as described above, even if particles adhere to the wafer surface, portions not implanted with ions under the particles (shaded portions) can be made smaller and thus the delamination can be performed uniformly.

Further, in the production method of the present invention, a silicon single crystal wafer can be used as the first wafer.

If a silicon single crystal wafer is used as the first wafer as described above, an SOI wafer that has very uniform SOI layer thickness can be produced at a low cost, and therefore it can be widely used for various devices.

Further, it is also preferable to preliminarily form an oxide film on the surface of the first wafer before the ion implantation.

This is because, if a thermal oxide film, a CVD oxide film or the like is formed on a surface before the ion implantation, degradation of the implantation profile (broadening along the depth direction) due to the channeling phenomenon during the ion implantation can be reduced, and generation of voids (unbonded portion) during the bonding with the second wafer can also be reduced.

Further, in the present invention, as the second wafer, a silicon single crystal wafer can be used.

If a silicon single crystal wafer is used as the second wafer, i.e., the base wafer, a wafer excellent in flatness can be obtained, and moreover, a wafer having a large diameter of 200 mm or 300 mm or larger can also be obtained.

Furthermore, an oxide film may be preliminarily formed on a surface of the second wafer before bonding.

By forming a thermal oxide film, a CVD oxide film or the like on the second wafer surface as described above, the generation of voids formed during the bonding with the first wafer can be reduced.

Further, a bonded wafer of extremely high quality in which the generation of micro-voids is reduced can be obtained by the method of the present invention.

Thus, according to the present invention, there can be provided a bonded wafer free from micro-voids by the ion implantation and delamination method.

Further, the bonded wafer of the present invention is a bonded wafer produced by bonding a second wafer to a first wafer having a micro bubble layer (implanted layer) into which at least either hydrogen ions or rare gas ions are implanted on its ion-implanted surface and delaminating them at the micro bubble layer of the first wafer, wherein the bonded wafer is free from micro-voids generated by particles adhering to the ion-implanted surface.

As described above, the present invention can provide, in particular, a bonded wafer produced by the ion implantation and delamination method wherein the bonded wafer is free from micro-voids generated by particles adhering to the ion-implanted surface.

As explained above, according to the ion implantation and delamination method of the present invention, the micro-voids generated by particles adhering to the ion-implantation surface can be reduced or eliminated, and a high quality bonded wafer can be easily produced.

BRIEF EXPLANATION OF THE DRAWINGS

FIG. 3 is an explanatory diagram showing the generation mechanism of micro-voids in the conventional ion implantation and delamination method.

BEST MODE FOR CARRYING OUT THE INVENTION

Figure 1:
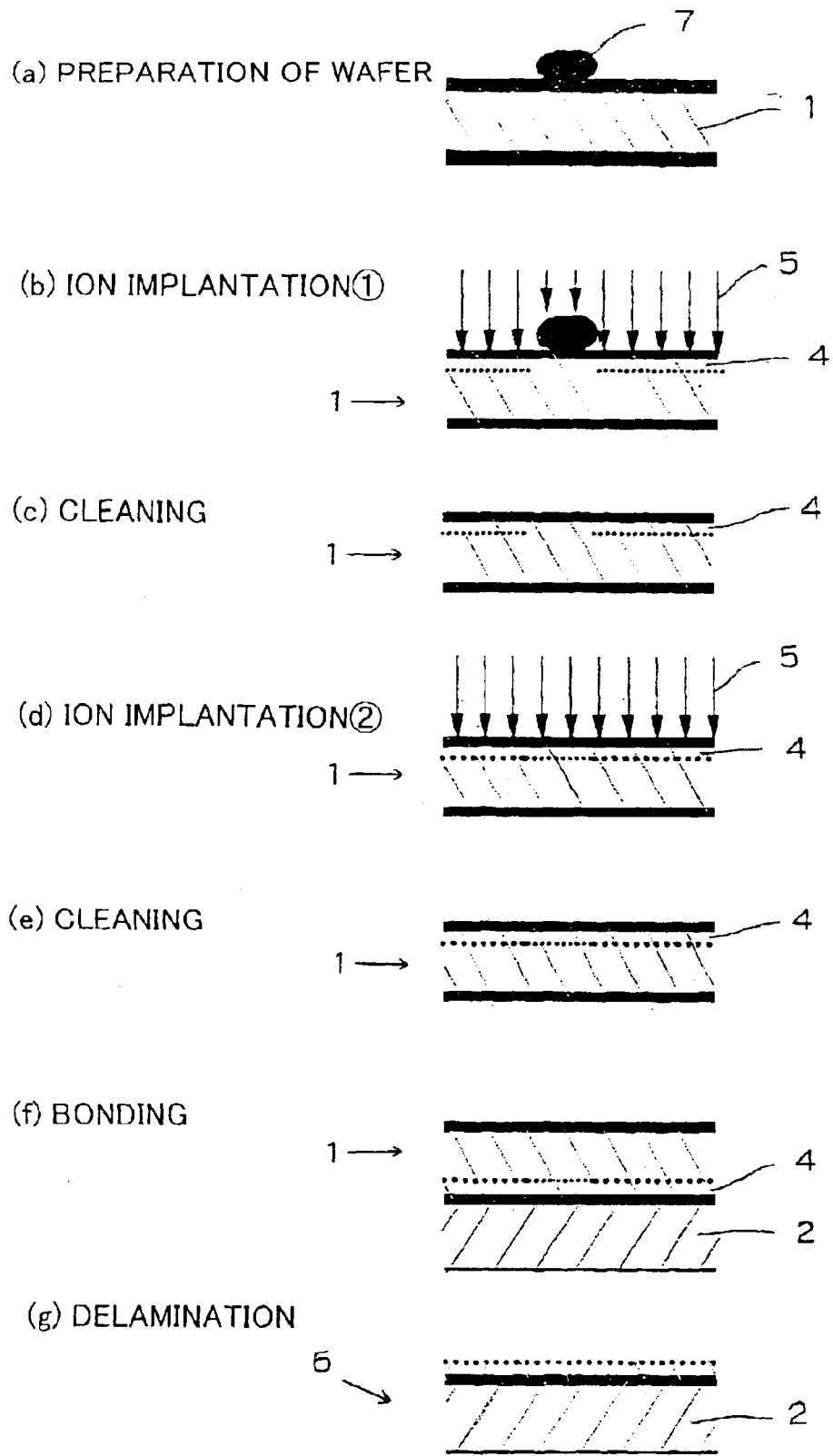
FIG. 1 is a flow chart showing a process of the ion implantation and delamination method of the present invention.

Hereafter, embodiments of the present invention will be explained in detail. However, the present invention is not limited to these.

According to the investigations of the inventors of the present invention about generation positions of micro-voids in the ion implantation and delamination method, in many cases, the generation positions matched positions of particles determined immediately before the bonding, i.e., after performing the ion implantation and the subsequent cleaning. However, they are sometimes generated regardless of the positions of particles immediately before the bonding.

Therefore, relationship of the voids with positions of particles immediately after the ion implantation was then investigated. As a result, it was found that there exist micro-voids at positions corresponding to the positions of the particles immediately after the ion implantation. Based on this fact, the cause for the generation of micro-voids was investigated, and the following consideration could be obtained as a result. FIG. 3 is a schematic diagram for explaining the generation mechanism of micro-voids.

FIG. 3(a) shows a first wafer immediately before performing the hydrogen ion implantation. Although cleaning of the first wafer (bond wafer) 1 is performed before the hydrogen ion implantation, a particle 7 may adhere to the first wafer surface during setting of the wafer on an ion implantation apparatus or during the ion implantation. If the ion implantation is performed in a state that the particle 7 has adhered, there is generated a region where hydrogen ions 5 are not implanted into a portion shaded by the particle as shown in FIG. 3(b).

And it is possible to remove the particle that had adhered to the first wafer surface by cleaning the first wafer after the ion implantation as shown in FIG. 3(c). However, since the micro bubble layer (implanted layer) 4 required for the delamination is not formed in the region in which the ion implantation was not attained, the delamination cannot be obtained for that portion when the first wafer is bonded to the second wafer (base wafer) 2 (FIG. 3(d)) and then they are delaminated by a delamination heat treatment, but they are separated at the bonded surfaces (FIG. 3(e)). It is considered that a micro-void 8 is generated on the surface of the bonded wafer 6 after delamination by such a mechanism as described above.

That is, it will be possible to completely prevent the generation of such a micro-void if there is obtained a first wafer surface on which no particle adheres at the time of the ion implantation. However, it is extremely difficult to obtain such a no particle state. Therefore, it was conceived that the ion implantation should be performed in divided steps.

That is, if the ion implantation is performed in divided multiple steps, where the total implantation dose of the implantation steps should be set to obtain the dose required for the delamination, and for example, cleaning is performed at least once during an interval between the implantation steps, even though a particle is adhered in the first implantation step, a region where ions were not implanted during the first implantation step due to the adhered particle may be implanted with ions in a subsequent implantation by performing cleaning of the wafer at least once to remove the particle, because the possibility that another particle adheres again at the same position is extremely low.

In this case, for the wafer cleaning process performed during an interval between the multiple ion implantation steps, there can be used cleaning utilizing a chemical solution usually used for removal of particles such as chemical cleaning with a system containing ammonia, hydrogen peroxide and water (SC-1). However, the cleaning is not limited to the above, and cleaning not utilizing a chemical solution such as pure wafer rinse with applying ultrasonic wave and cleaning with electrolytic ion-containing water may also be used so long as particles can be removed.

FIG. 1 shows processes for producing a bonded wafer in which the ion implantation is performed in two steps and cleaning is once performed as an intermediate step.

FIG. 1(a) shows the first wafer immediately before performing the first hydrogen ion implantation, and cleaning of the first wafer 1 is performed before the hydrogen ion implantation. In this case, a particle 7 may adhere to the first wafer surface during the period for setting the wafer on an ion implantation apparatus or during the ion implantation. If the ion implantation is performed in a state that the particle 7 has adhered, a region where hydrogen ions are not implanted is formed at the region shaded by the particle 7 as shown in FIG. 1(b).

And, by cleaning the first wafer after the first ion implantation, the particle that had adhered to the first wafer surface is removed as shown in FIG. 1(c), and the particle 7 on the region where the ions are not implanted is eliminated.

Subsequently, if the second hydrogen ion implantation is performed, hydrogen ions will be sufficiently implanted also into the region that was shaded by the particle, and a micro bubble layer required for the delamination will be formed (FIG. 1(d)). Then, the first wafer that had been subjected to two hydrogen ion implantation steps is cleaned to secure a clean surface (FIG. 1(e)). Subsequently, it is bonded to the second wafer 2 (FIG. 1(f)) and then subjected to a delamination heat treatment, and consequently a bonded wafer 6 having no micro-void after the delamination can be produced (FIG. 1(g)).

The implantation dose in the region where the particle had adhered may be smaller than a region where the total implantation dose was completely implanted, and it may not reach an implantation dose required for the delamination. However, since such regions are quite few from the first, if a defect layer (micro bubble layer, implanted layer) is formed to a certain extent, the delamination can be generated for the reasons that excessive bubbles diffuse into such regions from the surrounding area thereof and so forth.

Further, by changing the implantation angle in each of the divided ion implantation steps when the ion implantation is performed, the non-implanted region generated by a particle can also be made smaller. In this case, if the implantation angles are suitably adjusted, it is also possible to achieve the object without performing the wafer cleaning during an interval between the implantation steps.

Figure 2:
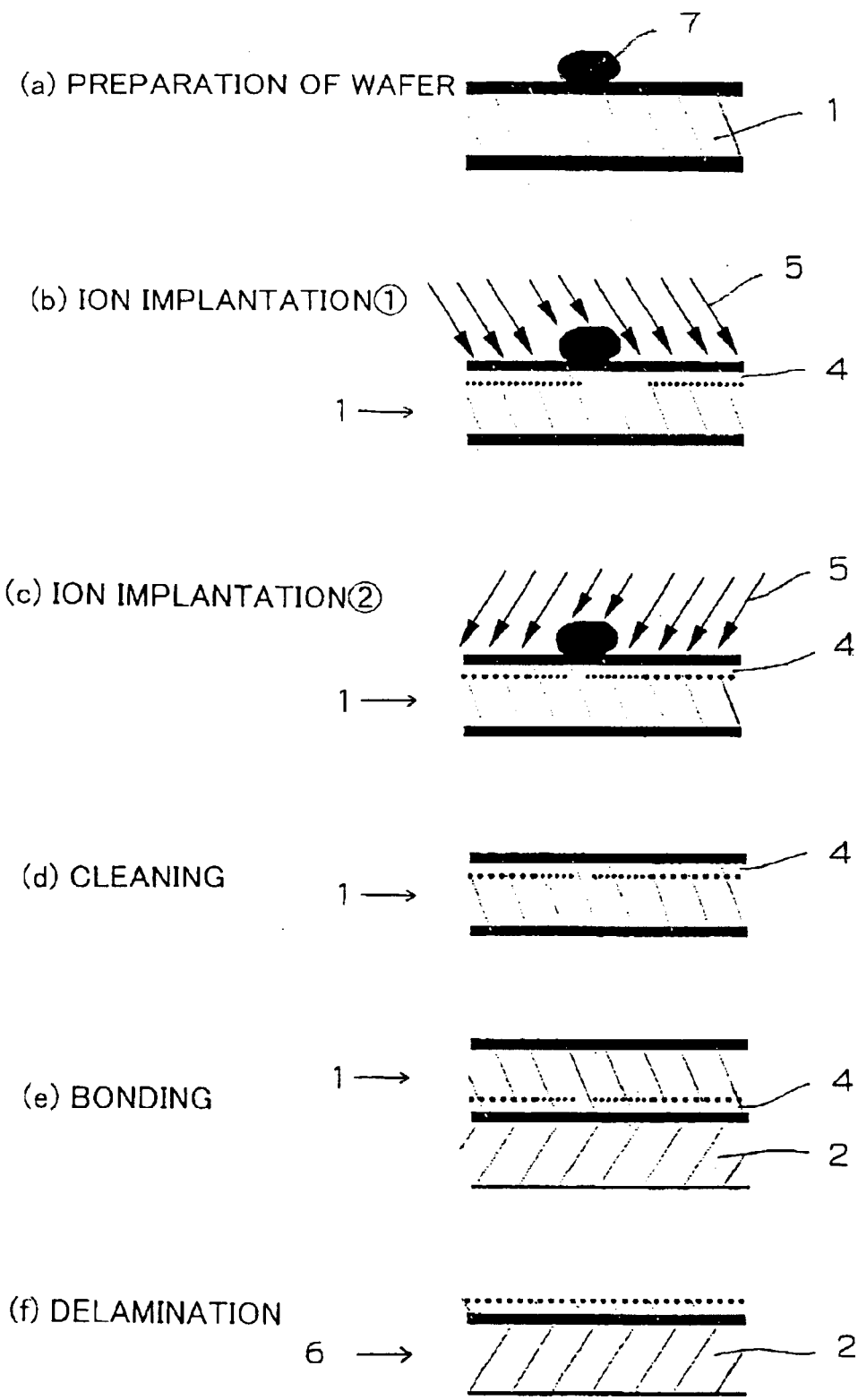
FIG. 2 is a flow chart showing another process of the ion implantation and delamination method of the present invention.

Processes in which the ion implantation angle is changed are shown in FIG. 2. There is shown a situation in which the first ion implantation is performed from a left oblique upward direction of a particle (FIG. 2(b)), and the second ion implantation is performed from a right oblique upward direction of the particle (FIG. 2(c)).

This makes the region shaded by the particle extremely small, and the generation of micro-void is not observed after the delamination (FIG. 2(f)).

In the present invention, wafers to be bonded can be arbitrarily selected according to the purpose, and are not particularly limited. However, if a silicon single crystal wafer is used as the first wafer, for example, an SOI wafer having an SOI layer of which film thickness is extremely uniform can be produced at a low cost, and it can be widely applied for various devices. Moreover, in case of a silicon wafer, it is also suitable for the production of the wafer of larger diameter.

Further, an oxide film is preferably formed beforehand on the surface of the first wafer before the implantation.

This is because, if a thermal oxide film, CVD oxide film or the like is formed on the surface before the ion implantation, degradation of the implantation profile (broadening along the depth direction) due to the channeling phenomenon during the ion implantation can be reduced, and generation of voids (unbonded portions) at the time of the bonding with the second wafer can also be reduced.

Further, in the present invention, as the second wafer, a silicon single crystal wafer can be used, and wafers other than silicon can also be used depending on the purpose.

If a silicon single crystal wafer is used as the second wafer, i.e., a base wafer, a wafer having good flatness can be obtained. Thus, flatness of wafers after bonding is also improved, and it will be preferable also for the subsequent device production process. In addition, it is also relatively easy to obtain a wafer having a large diameter of 200 mm or 300 mm or larger.

Furthermore, it is also possible to preliminarily form an oxide film on the surface of the second wafer before the bonding. By forming preliminarily a thermal oxide film, CVD oxide film or the like on the second wafer surface as described above, generation of voids can be reduced in the bonding with the first wafer.

Hereafter, the present invention will be specifically explained with reference to the following examples of the present invention and comparative example. However, the present invention is not limited to these.

EXAMPLE 1

Ten bonded wafers were produced according to the processes shown in FIG. 1.
(a) Preparation of first wafer: Silicon single crystal wafers having a diameter of 200 mm, orientation of <100> and an oxide film with a thickness of 400 nm were prepared.
(b) First hydrogen ion implantation: Implantation energy of 100 keV, implantation dose of $5\times10^{16}/cm^2$
(c) Cleaning: Each wafer was cleaned with SC-1 (cleaning solution of $H_2O/H_2O_2/NH_4OH$ type, immersed at 70° C. for 3 minutes), then subjected to ultrasonic rinse and dried with IPA.
(d) Second hydrogen ion implantation: Implantation energy of 100 keV, implantation dose of $3\times10^{16}/cm^2$
(e) Cleaning: Each wafer was cleaned by using SC-1, SC-2 (cleaning solution of $H_2O/H_2O_2/HCl$ type, immersed at 80° C. for 3 minutes) and SC-1 in this order and dried with IPA.
(f) Bonding: The first wafer was bonded to a second wafer of a silicon single crystal (with no oxide film) at room temperature.
(g) Delamination: The wafers were delaminated by a heat treatment at 500° C. for 30 minutes in a nitrogen atmosphere.
<Observation of Micro-voids>

As for micro-voids, when a surface of a bonded wafer is measured by using a particle measurement apparatus of light scattering type utilizing a laser or the like as a light source to obtain coordinates of particles within a plane of the bonded wafer and those detected as bright spots (particles) showing strong scattered light and having a large size are observed with an optical microscope, they can be confirmed as bonding failures, i.e., micro-voids. Since a certain degree of correlation is obtained between the size of the bright spots detected by a particle measurement apparatus and result of optical microscope observation, simple evaluation is possible only by using a particle measurement apparatus. Therefore, the whole surface of each wafer was observed by using a particle measurement apparatus and an optical microscope as the measurement apparatuses. As a result, micro-voids were observed in neither of the wafers at all.

EXAMPLE 2

Ten bonded wafers were produced according to the processes shown in FIG. 2.
(a) Preparation of first wafer: Silicon single crystal wafers having a diameter of 200 mm, orientation of <100> and an oxide film with a thickness of 400 nm were prepared.
(b) First hydrogen ion implantation: Implantation angle of 15°, implantation energy of 100 keV, implantation dose of $4\times10^{16}/cm^2$
(c) Second hydrogen ion implantation: Implantation angle of −15°, implantation energy of 100 keV, implantation dose of $4\times10^{16}/cm^2$
(d) Cleaning: Each wafer was cleaned with SC-1, SC-2 and SC-1 in this order and dried with IPA.
(e) Bonding: The first wafer was bonded to a second wafer of a silicon single crystal (with no oxide film) at room temperature.
(f) Delamination: The wafers were delaminated by a heat treatment at 500° C. for 30 minutes in a nitrogen atmosphere.
<Observation of Micro-voids>

Density of micro-voids having a diameter of about 1 μm was extremely low, i.e., about 3 per wafer having a diameter of 200 mm in average.

COMPARATIVE EXAMPLE 1

Ten bonded wafers were produced according to the processes shown in FIG. 3.
(a) Preparation of first wafer: Silicon single crystal wafers having a diameter of 200 mm, orientation of <100> and an oxide film with a thickness of 400 nm were prepared.
(b) Hydrogen ion implantation: Implantation was performed once with implantation energy of 100 keV and implantation dose of $8\times10^{16}/cm^2$.
(c) Cleaning: Each wafer was cleaned with SC-1, SC-2 and SC-1 in this order and dried with IPA.
(d) Bonding: The first wafer was bonded to a second wafer of a silicon single crystal (with no oxide film) at room temperature.
(e) Delamination: The wafers were delaminated by a heat treatment at 500° C. for 30 minutes in a nitrogen atmosphere.
<Observation of Micro-voids>

Density of micro-voids having a diameter of about 1 μm was about 28 per wafer having a diameter of 200 mm in average, and thus the wafers had a lot of defects.

The present invention is not limited to the embodiments described above. The above-described embodiments are mere examples, and any of those having the substantially same structure as that described in the appended claims and providing the similar functions and advantages are included in the scope of the present invention.

According to the present invention, there are provided wafers produced by the ion implantation and delamination method including not only those obtained by bonding silicon single crystal wafers to each other as mentioned above, but also SOI wafers having an SOI layer, and there are also provided wafers obtained by bonding a silicon single crystal wafer and an insulator wafer or insulator wafers to each other.

What is claimed is:

1. A method for producing a bonded wafer comprising at least an ion implantation process where at least either hydrogen ions or rare gas ions are implanted into a first wafer from its surface to form a single micro bubble layer (implanted layer) in the first wafer, a bonding process where the surface subjected to the ion implantation of the first wafer is bonded to a surface of a second wafer, and a delamination process where the first wafer is delaminated at the micro bubble layer, wherein the ion implantation process is performed in divided multiple steps to form the single bubble layer in the first wafer, and a total implantation dose of the divided multiple implantation steps for the single bubble layer is set to obtain a dose required for the delamination, and a wafer cleaning process is performed at least once during an interval between the multiple ion implantation steps.

2. The method for producing a bonded wafer according to claim 1, wherein the ion implantation is performed with different implantation angles for ions to be implanted in the multiple ion implantation steps.

3. A bonded wafer produced by the production method according to claim 2.

4. The method for producing a bonded wafer according to claim 1, wherein a silicon single crystal wafer is used as the first wafer.

5. The method for producing a bonded wafer according to claim 4, wherein an oxide film is preliminarily formed on the surface of the first wafer before the ion implantation.

6. A bonded wafer produced by the production method according to claim 1.

7. A method for producing a bonded wafer comprising at least an ion implantation process where at least either hydrogen ions or rare gas ions are implanted into a first wafer from its surface to form a single micro bubble layer (implanted layer) in the first wafer, a bonding process where the surface subjected to the ion implantation of the first wafer is bonded to a surface of a second wafer, and a delamination process where the first wafer is delaminated at the micro bubble layer, wherein the ion implantation process is performed in divided multiple steps to form the single bubble layer in the first wafer, and a total implantation dose of the divided multiple implantation steps for the single bubble layer is set to obtain a dose required for the delamination, and the ion implantation is performed with different implantation angles for ions to be implanted in the multiple ion implantation steps.

8. The method for producing a bonded wafer according to claim 7, wherein a silicon single crystal wafer is used as the first wafer.

9. The method for producing a bonded wafer according to claim 8, wherein an oxide film is preliminarily formed on the surface of the first wafer before the ion implantation.

10. A bonded wafer produced by the production method according to claim 7.

11. A bonded wafer produced by bonding a second wafer to a first wafer having a micro bubble layer (implanted layer) into which at least either hydrogen ions or rare gas ions are implanted on its ion-implanted surface and delaminating them at the micro bubble layer of the first wafer, wherein the bonded wafer is free from bonding failure portions generated by particles adhering to the ion-implanted surface and shading the portions from the ion-implantation.

* * * * *